United States Patent [19]

Obeng

[11] Patent Number: 5,538,921
[45] Date of Patent: Jul. 23, 1996

[54] INTEGRATED CIRCUIT FABRICATION

[75] Inventor: Yaw S. Obeng, Orlando, Fla.

[73] Assignee: AT&T Corp., Murray Hill, N.J.

[21] Appl. No.: 362,616

[22] Filed: Dec. 22, 1994

[51] Int. Cl.$^6$ .............................. H01L 21/44; H01L 21/48
[52] U.S. Cl. ...................... 437/190; 437/194; 437/197; 437/198; 437/199; 437/225; 437/246
[58] Field of Search ........................... 437/225, 189, 437/194, 196, 197, 198, 199, 246, 190

[56] References Cited

U.S. PATENT DOCUMENTS

| 4,529,800 | 6/1986 | Landau et al. | 437/225 |
| 5,198,388 | 3/1993 | Kawai | 437/190 |
| 5,290,733 | 3/1994 | Hayasaka et al. | 437/225 |
| 5,312,776 | 5/1994 | Murakami et al. | 437/194 |
| 5,345,108 | 9/1994 | Kikkawa | 257/751 |
| 5,427,666 | 6/1995 | Mueller et al. | 437/190 |

Primary Examiner—Trung Dang
Attorney, Agent, or Firm—John T. Rehberg

[57] ABSTRACT

After multilayer conductive stacks are defined in a semiconductor processing sequence, rinsing with a dilute solution of surfactants is performed to remove halogen residues which may ultimately contribute to subsequent undesirable corrosion of the stack.

8 Claims, 1 Drawing Sheet

5,538,921

INTEGRATED CIRCUIT FABRICATION

TECHNICAL FIELD

This invention relates to integrated circuits and methods for their fabrication.

BACKGROUND OF THE INVENTION

Many modern integrated circuits use multilayered stacks of conductive material (often termed "runners") to interconnect individual transistors. For example, referring to FIG. 1, reference numeral 11 denotes a substrate which is a dielectric, illustratively an oxide of silicon. Reference numeral 13 denotes a multilayered patterned conductor. Illustratively, reference numeral 15 may denote patterned titanium, while reference 17 may denote patterned titanium nitride, TiN. Reference 19 denotes patterned aluminum which may, illustratively, also contain predetermined amounts of copper and or silicon. Reference 21 may denote patterned TiN.

Those involved in the development of integrated circuits have noticed that corrosion of multilayered conductors 13 is a serious problem which affects integrated circuit reliability.

SUMMARY OF THE INVENTION

Illustratively, the present invention improves reliability and includes forming first and second layers of conductive material overlying a substrate. The first and second conductive materials are patterned to form a runner. Then the runner is exposed to a surfactant.

DETAILED DESCRIPTION

Figure 1:
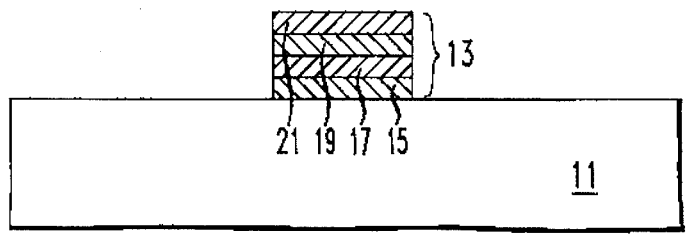
FIGS. 1–5 are cross-sectional use of a partially fabricated integrated circuit, useful in understanding an illustrative embodiment of the present invention.

Applicant has concluded that, in FIG. 1, the electrochemical potential difference between dissimilar conductive materials in the multilayered stack 13 makes the stack 13 very susceptible to corrosion the electrochemical processes. For example, aluminum 19, and titanium nitride, 21 or 17 may serve as anode and cathode respectively. These electrochemical processes produce corrosion which may manifest itself in a variety of ways, for example, in missing metal lines or nonmetallic residues protruding from the sides of metal lines, or voids in metal lines.

The electrochemical processes involved in the corrosion require an electrolyte to bridge the cathode and anode, thereby shuttling charge between the cathode and anode. In modern integrated circuit processing, the electrolyte may be formed from residual etchants utilized in the metal patterning steps. In various etching processes, residues made to contain halogen ions ($Cl^-$, $F^-$) and unreacted halogen molecules ($Cl_2$ and $F_2$) which may be trapped inside the residual polymers which build up next to the metal stack during and after etching. The aforementioned species may react with moisture to form acids which serve as electrolytes.

Thus, efficient and reliable removal of residual halogen species from etched metal systems is of paramount importance in order to minimize corrosion.

Figure 2:
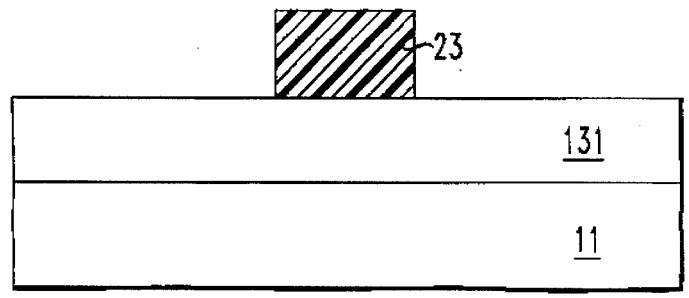

In FIG. 2, Reference numeral 11 denotes a substrate which may, illustratively, be a dielectric, illustratively an oxide of silicon. Reference numeral 131 denotes an patterned conductive layer which is illustratively a blanket multilayer conductor. For example, 131 may denote a Ti/TiN/AlSiCu/TiN stack. Reference numeral 23 denotes a patterned photoresist.

Figure 3:
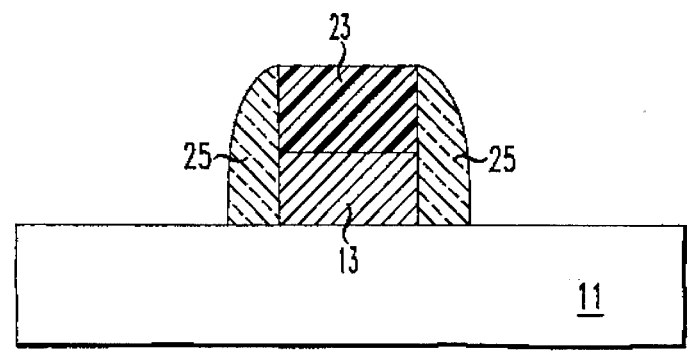

Stack 131 is etched in a plasma. For example, the plasma may contain $BCl_3$, or $Cl_2$, or $CHCl_3$, or O2, or a combination of these gases, illustratively at 20 mTorr and 50° C. The etching process converts metal to volatile metal halides and passivates exposed metals surfaces with an organometallic/organic polymer. The resulting structure is illustrated in FIG. 3. Reference numeral 13 denotes a patterned conductive stack formed from the patterning of blanket layer 131. Reference numeral 25 denotes the organometallic/organic polymer which covers the exposed surfaces of conductive stack 13.

Applicant has found that, at this point, rinsing the etched metal stack with a solution of either non-ionic or ampholytic surfactant effectively removes residual halogens, helps to passivate the metal stack and minimize subsequent corrosion. A dilute (~1%) solution of an non-ionic surfactant, such as Triton X-100 (Triton is a trademark of Rohm and Haas, Philadelphia, Pa.), which comprises polyoxyethylene p-o-octyl phenol is suitable. (Triton X-100 is a member of the Triton X-series of surfactants.) Another suitable non-ionic surfactant is polyoxyethylenenonylphenol (utilized in the Triton N-series surfactants.) Ampholytic surfactants including dodecyl-N-betaine and palmitoyllysolecithin are also suitable. Consequently, the structure of FIG. 3, at this point may be subjected, illustratively, to a ten minute rinse in a 1% solution of surfactant, such as Triton X-100

After the above-mentioned rinse in the surfactant, more conventional processing may resume. A 10 minute rinse in a static deionized, $CO_2$ sparged water bath at room temperature is performed. Then a spin rinse drying step under nitrogen is performed. In the past, spraying the structure of FIG. 3 with $CO_2$ sparged deionized water without the preliminary rinsing in surfactant has not been very effective in removing all the residual halogens.

Figure 4:
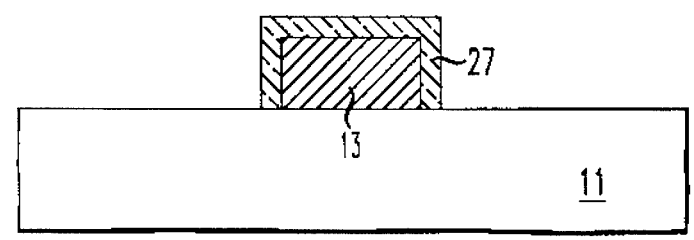

Turning to FIG. 4, photoresist 23 is removed in an oxygen plasma at 200° C. The plasma converts the organic photoresist to $CO_2$ and tends to form an oxide coating 27 on the exposed surfaces of stack 13.

Figure 5:
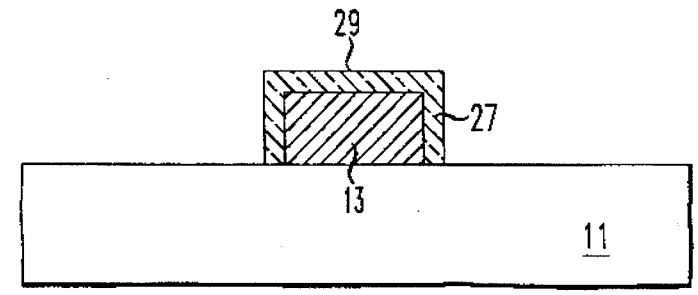

Turning to FIG. 5, a sodium removal step is performed. The structure is subjected to a $CF_4/O_2$ plasma at 2 Torr, and 39°–40° C. The plasma removes some of the top surface 29 of the oxide 27 previously formed. Furthermore, the plasma tends to liberate any alkali metal contaminants which may be present on the surface of stack 13. The liberated contaminants are then rinsed away in water.

Applicant conducted an experiment with two groups of wafers. One group of wafers (the first group) were subjected to the processing steps described in connection with FIGS. 2–5 above. The other group (the second group) did not receive the 10 minute pre-rinse in 1% TX-100 surfactant. However, all of the other processing steps for the second group were the same as the first group. Subsequently, both groups of wafers were stored together in a 94% humidity chamber at 21±1° C. to accelerate corrosion for 24 hours. Wafers were then examined by a KLA wafer level inspection system manufactured by KLA Instrument Corporation, San Jose, Calif. The wafers which did not receive the surfactant treatment showed approximately 20 defects sites per wafer. However, the wafers which received the surfactant rinse showed no new defects after the accelerated corrosion test.

I claim:

1. A method of semiconductor integrated circuit fabrication comprising:

forming first and second layers of conductive material overlying a substrate;

patterning said first and said conductive materials to form a runner;

exposing said runner to surfactant; and next, rinsing said runner in water.

2. The method of claim 1 in which said first layer is aluminum.

3. The method of claim 1 in which said second layer is TiN.

4. The method of claim 1 in which said first layer is aluminum;

said second layer is TiN and is beneath said first layer and further including forming a third layer of Ti beneath said second layer and in contact with said substrate;

and including a fourth layer of TiN over said first layer, and in which said first, second, third and fourth layers are patterned.

5. The method of claim 1 in which said said surfactant is chosen from the group consisting of non-ionic surfactants and ampholytic surfactants.

6. The method of claim 1 in which said patterning utilizes a plasma containing a halogen.

7. The method of claim 1 in which said surfactant is chosen from the group consisting of polyoxyethylene p-o-octylphenol and polyoxyethylenenonylphenol.

8. The method of claim 1 in which said surfactant is chosen from the group consisting of dodecyl-n-betaine and palmitollysolecithin.

* * * * *